United States Patent
Yamaguchi et al.

(10) Patent No.: US 6,720,200 B2
(45) Date of Patent: Apr. 13, 2004

(54) FIELD EFFECT TRANSISTOR AND FABRICATION PROCESS THEREOF

(75) Inventors: Keiko Yamaguchi, Tokyo (JP); Naotaka Iwata, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/862,870

(22) Filed: May 22, 2001

(65) Prior Publication Data

US 2001/0024846 A1 Sep. 27, 2001

Related U.S. Application Data

(62) Division of application No. 08/958,692, filed on Oct. 27, 1997, now Pat. No. 6,426,523.

(30) Foreign Application Priority Data

Oct. 30, 1996 (JP) .............................. 8-288610

(51) Int. Cl.⁷ .......................... H01L 21/00; H01L 21/28
(52) U.S. Cl. ........................... 438/47; 438/46; 438/93; 438/94; 438/577
(58) Field of Search ................... 438/46, 47, 41, 438/42, 44, 93, 94, 576, 577

(56) References Cited

U.S. PATENT DOCUMENTS

| 4,578,343 A | * 3/1986 | Kosemura et al. ........... 438/571 |
| 4,615,102 A | * 10/1986 | Suzuki et al. ............... 438/172 |
| 4,618,510 A | * 10/1986 | Tan ........................... 438/571 |
| 4,742,026 A | * 5/1988 | Vatus et al. ................. 438/712 |

(List continued on next page.)

FOREIGN PATENT DOCUMENTS

| EP | 0371686 | 11/1989 | ........... H01L/21/28 |
| JP | 56-91477 | 7/1981 | ........... H01L/29/80 |
| JP | 59-168677 | 9/1984 | ........... H01L/29/80 |
| JP | 61-140181 | 6/1986 | ........... H01L/29/80 |
| JP | 62202564 | 9/1987 | ........... H01L/29/80 |
| JP | 63-211770 | 9/1988 | ........................ 29/80 |
| JP | 4-260338 | 9/1992 | ........... H01L/21/338 |
| JP | 4-280640 A | * 10/1992 | ........... H01L/21/338 |
| JP | 4280640 | 10/1992 | ........... H01L/21/338 |
| JP | 7263383 | 10/1995 | ........... H01L/21/302 |

OTHER PUBLICATIONS

"Fabrication of High Breakdown Pseudomorphic Modulation Doped Field Effect Trnasistors Using Double Dry Etched Gate Recess Technology in Combination with E-Beam T-Gate Lithography" Hulsmann et al; Jpn. J. Appl. Phys. vol. 33 (1994); pp. 7194-7198; Part 1. No. 12B; Dec. 1994.

"High Efficiency Power Module Using HEMT for PDC" Yoshida et al Preliminary Report of 1996 Institute of Electronics, Communication and Information; Electronics Science Meeting, C-422; p. 80, 1996.

*Primary Examiner*—Matthew Smith
*Assistant Examiner*—Lex H. Malsawma
(74) *Attorney, Agent, or Firm*—Hayes Soloway P.C.

(57) ABSTRACT

Using a mask opening a gate region, an undoped GaAs layer is selectively etched with respect to an undoped $Al_{0.2}Ga_{0.8}As$ layer by dry etching with introducing a mixture gas of a chloride gas containing only chlorine and a fluoride gas containing only fluorine (e.g. $BCl_3+SF_6$ or so forth). By about 100% over-etching is performed for the undoped GaAs layer, etching (side etching) propagates in transverse direction of the undoped GaAs layer. With using the mask, a gate electrode of WSi is formed. Thus, a gap in a width of about 20 nm is formed by etching in the transverse direction on the drain side of the gate electrode. By this, a hetero junction FET having reduced fluctuation of characteristics of an FET, such as a threshold value, lower a rising voltage and higher breakdown characteristics.

6 Claims, 16 Drawing Sheets

U.S. PATENT DOCUMENTS

| | | | | |
|---|---|---|---|---|
| 4,908,325 A | | 3/1990 | Berenz | 437/40 |
| 5,021,857 A | * | 6/1991 | Suehiro | 257/392 |
| 5,270,228 A | * | 12/1993 | Ishikawa | 438/167 |
| 5,288,654 A | * | 2/1994 | Kasai et al. | 438/577 |
| 5,364,816 A | * | 11/1994 | Boos et al. | 438/172 |
| 5,468,343 A | * | 11/1995 | Kitano | 438/745 |
| 5,504,353 A | * | 4/1996 | Kuzuhara | 257/194 |
| 5,563,079 A | * | 10/1996 | Shin et al. | 438/571 |
| 5,608,239 A | * | 3/1997 | Miyamoto et al. | 257/192 |
| 5,610,090 A | * | 3/1997 | Jo | 438/577 |
| 5,668,387 A | * | 9/1997 | Streit et al. | 257/192 |
| 5,824,575 A | * | 10/1998 | Fujimoto et al. | 438/174 |
| 5,905,277 A | * | 5/1999 | Ota et al. | 357/192 |

* cited by examiner

SIDE ETCHING

SIDE ETCHING

SIDE ETCHING

SIDE ETCHING

FIELD EFFECT TRANSISTOR AND FABRICATION PROCESS THEREOF

This is a Divisional Application of Ser. No. 08/958,692 filed Oct. 27, 1997 now U.S. Pat. No. 6,426,523.

BACKGROUND OF THE INVENTION

1. Field of the Invention

The present invention relates generally to a field effect transistor (FET) and a fabrication process thereof. More particularly, the invention relates to a hetero junction FET and a fabrication process thereof.

2. Description of the Related Art

Conventionally, GaAs FETs have been widely employed as elements for high frequency. Particularly, in a high power element, in order to reliably achieve reduction of source resistance and higher gate breakdown voltage(gate tolerance voltage), a multi-stage recessed structure has been employed. FIGS. 1A to 1D are sections showing a recess formation process of a conventional GaAs FET, illustrating the process steps in sequential order. As shown in FIG. 1A, a channel layer 2 consisting of undoped InGaAs or undoped GaAs, is formed on a GaAs layer 1. On the channel layer 2, an Si doped AlGaAs layer 3 is formed. On the AlGaAs layer 3, an Si doped GaAs layer 4 is formed. Also, a wide recess 6 is formed by patterning the GaAs layer 4 employing a mask 5.

Next, as shown in FIG. 1B, a mask 7 is formed covering the upper surface and side surface of the GaAs layer 4 after patterning. Using the mask 7, an upper half of the AlGaAs layer 3 is patterned to form a recess 8 for a gate.

Subsequently, as shown in FIG. 1C, a gate electrode 9 is buried in the recess 8. Furthermore, as shown in FIG. 1D, after removing the mask 7, a source electrode 10 and a drain electrode 11 are selectively formed on the GaAs layer 4.

As set forth above, in a fabrication process of a conventional multi-stage recessed structure, the recesses are formed by patterning the masks per each stage and wet etching process with an etching liquid containing sulfuric acid as primary component.

However, in the fabrication process of a FET of a multi-stage recessed structure, exposure steps in number corresponding to number of recesses are required. On the other hand, since wet etching is performed every time of formation of the recess, fluctuation of etching can cause degradation of uniformity and reproducibility of FET characteristics (particularly threshold voltage).

Particularly, in FIG. 1B, a shape of a recess 8 formed by etching immediately before providing the gate, significantly influences threshold value.

On the other hand, there has been proposed a recess forming technology by selective dry etching of the GaAs layer using the InGaAs layer or AlGaAs layer as an etching stopper (Japanese Unexamined Patent Publication No. Heisei 4-280640). However, a conventional recess forming process by the selective dry etching is primarily directed to realization of the threshold value with high uniformity and no consideration is given for improvement of the FET characteristics per se.

On the other hand, in "High Efficiency Power Module Using HEMT for PDC", Preliminary Report of 1996 Institute of Electronics, Communication and Information, Electron-Science Meeting, C-422, there has been disclosed a multistage recessed InGaAs/AlGaAs HEMT, in which an etching stopper layer consisted of n⁻AlGaAs is provided between an n⁺GaAs layer and an n⁻GaAs layer to perform selective etching to form the recessed structure with good controllability and reproduction ability. On the other hand, in FIG. 1 of the above-identified publication, there is disclosed a structure, in which a gate metal and a neighborhood semiconductor layer are not contacted.

In the above-identified publication, there is no disclosure of a fabrication process of the HEMT. Thus, assuming from the structure, since the mask for forming the gate metal is formed after formation of the two stage recessed structure through at least two lithographic steps, at least three lithographic steps are necessary.

SUMMARY OF THE INVENTION

It is an object of the present invention to improve FET characteristics by improving an electrode structure of an FET.

Another object of the present invention is to provide a fabrication process of an FET with lesser fluctuation of characteristics of the FET, such as threshold value or so forth, with lower rising voltage, achieving a hetero junction FET structure having high breakdown voltage (tolerance voltage) characteristics with high uniformity and reproduction ability, and with high yield.

A further object of the present invention is to provide a fabrication process of an FET, in which a gate portion of a hetero junction FET of a multi-stage recessed structure having good characteristics, or an ohmic electrode having a lower contact resistance of the FET can be formed simply with high uniformity and reproduction capacity.

A first aspect of the field effect transistor according to the present invention comprises: a hetero junction semiconductor crystal having at least a channel layer of InGaAs or GaAs, a first AlGaAs layer, a first GaAs layer, a second AlGaAs layer and an n-type second GaAs layer; and an ohmic electrode contacting with said second GaAs layer and said channel layer or with said second GaAs layer and said first AlGaAs layer doped with a donor.

Also, said field effect transistor may include a gate electrode having a two stage recess structure, in which said first and second GaAs layers are removed in stepwise fashion in the vicinity of said gate electrode forming portion, said gate electrode having a gap between said first GaAs layer and said gate electrode on said first AlGaAs layer, whereby said gate electrode does not contact said first GaAs layer.

A second aspect of the field effect transistor according to the present invention comprises: a hetero junction semiconductor crystal at least including a channel layer of InGaAs or GaAs, a first AlGaAs layer, a first GaAs layer, a second AlGaAs layer and an n-type second GaAs layer, said hetero junction semiconductor crystal having a two stage recess structure removed from said first and second GaAs layers in stepwise fashion in the vicinity of a gate electrode forming portion; and a gate electrode having a gap on said first AlGaAs layer and between said first GaAs layer and said gate electrode, so as to not contact said gate electrode with said first GaAs layer, a gap between a drain region side of said gate electrode and said first GaAs layer being greater than said gap between the source region side of said gate electrode and said first GaAs layer.

A third aspect of the field effect transistor according to the present invention comprises: a hetero junction semiconductor crystal at least including a channel layer of InGaAs or GaAs, a first AlGaAs layer, a first GaAs layer, a second AlGaAs layer and a high concentration ntype second GaAs layer, said hetero junction semiconductor crystal having a two stage recess structure removed from said first and second GaAs layers in stepwise fashion in the vicinity of a gate electrode forming portion; and a gate electrode having a gap on said first AlGaAs layer and between said first GaAs layer and said gate electrode, so as to not contact said gate electrode with said first GaAs layer, a gap between the source region side of said gate electrode and said first GaAs layer being greater than a gap between the drain region side of said gate electrode and said first GaAs layer.

A fourth aspect of the field effect transistor according to the present invention comprises: a hetero junction semiconductor crystal at least including a channel layer of InGaAs or GaAs, an AlGaAs layer, a layer of InAlAs or InAlGaAs and an n-type GaAs layer, said hetero junction semiconductor crystal having a two stage recess structure removed from said n-type GaAs layer and a layer of InAlAs or InAlGaAs in the vicinity of a gate electrode; and a gate electrode provided on said AlGaAs layer, defining a gap between said gate electrode and said layer of InAlAs or InAlGaAs so as to not contact said gate electrode with said layer of InAlAs or InAlGaAs.

The width of said gap between the drain region side of said gate electrode and the layer of InAlAs or InAlGaAs may be different from the width of said gap defined between the source region side of said gate electrode and the layer of InAlAs or InAlGaAs.

A first aspect of the fabrication process of a field effect transistor according to the present invention comprises the steps of: forming a hetero junction semiconductor crystal having a channel layer of InGaAs or GaAs, a first AlGaAs layer, a first GaAs layer, a second AlGaAs layer and an n-type second GaAs layer; forming a two stage recess structure by selective etching of said first GaAs layer and said second GaAs layer with respect to said first AlGaAs layer and said second AlGaAs layer for removing said first and second GaAs layers in stepwise fashion in the vicinity of a gate electrode forming portion; performing etching in a transverse direction with respect to said first GaAs layer by performing excessive etching after extending to said first AlGaAs layer in said selective etching with respect to said first GaAs layer; and forming a gate electrode on said first AlGaAs layer so as to define a gap between said first GaAs layer and said gate electrode, whereby said gate electrode does not contact said first GaAs layer.

A second aspect of the fabrication process of a field effect transistor according to the present invention comprises the steps of: forming a hetero junction semiconductor crystal having a channel layer of InGaAs or GaAs, a first AlGaAs layer, a first GaAs layer, a second AlGaAs layer and an n-type second GaAs layer; selectively etching said first GaAs layer with respect to said first AlGaAs layer after said second GaAs layer and said second AlGaAs layer are removed using a mask which has an opening at an ohmic region; forming an ohmic electrode by deposition and lift off of ohmic metal and heat treatment for alloying so as to contact at least said second GaAs layer and said channel layer or said second GaAs layer and said first AlGaAs layer doped with a donor.

A third aspect of the fabrication process of a field effect transistor employing a hetero junction semiconductor crystal, in which a GaAs layer is stacked on an AlGaAs layer, according to the present invention comprises the steps of: performing anisotropic etching of said GaAs layer in an oblique direction from the upper side of one of regions of a source region and a drain region, by arranging a mask opening a gate electrode portion on the crystal; and forming a gate metal on said AlGaAs layer by deposition and lift off from above in the perpendicular direction with respect to a substrate or an ion beam method.

A fourth aspect of the fabrication process of a field effect transistor employing a hetero junction semiconductor crystal, in which a GaAs layer is stacked on an AlGaAs layer, according to the present invention comprises the steps of: arranging a first mask on said semiconductor crystal and performing an anisotropic etching of said first mask in an oblique direction toward a drain region from the upper side of a source region using a second mask opening a gate electrode portion; etching said GaAs layer using said first mask; and forming a gate electrode by deposition of a gate metal from above in the perpendicular direction with respect to a substrate and lift off or an ion beam method from above in the perpendicular direction with respect to said substrate.

A fifth aspect of the fabrication process of a field effect transistor according to the present invention comprises the steps of: forming a hetero junction semiconductor crystal having a channel layer of InGaAs or GaAs, an AlGaAs layer, a layer of InAlAs or InAlGaAs and an n-type GaAs layer; forming a first stage recess structure removing a part of said n-type GaAs layer; forming a mask for use in patterning a second stage recess structure; selectively etching said layer of InAlAs or InAlGaAs on said AlGaAs layer employing an etchant having a composition of (hydrogen chloride): (water)=1:x (x<6); and propagating etching in the transverse direction with respect to the layer of InAlAs or InAlGaAs by excessive etching after selective etching of said layer of InAlAs or InAlGaAs reaches said AlGaAs layer.

With the construction of an FET according to the present invention, a contact portion of the ohmic electrode becomes wide to reduce contact resistance. This invention is applicable not only for two stage recessed structure but also for a normal FET.

On the other hand, with the structure of the present invention, source resistance can be reduced and gate breakdown voltage can be improved.

Furthermore, with the structure of the present invention, resistance of the drain electrode can be lowered.

Also, according to the fabrication process of the present invention, the position of the gate electrode can be controlled between the source region and the drain region. Depending upon application of the FET, the position of the gate electrode or the interval between respective electrodes and the gate electrode can be controlled to adjust major characteristic parameters of the FET, such as source resistance,-drain resistance, gate breakdown voltage and so forth.

On the other hand, in the present invention, ohmic electrode structure with reduced ohmic resistance can be employed. Also, by employing a structure, in which the position of the gate electrode is controlled between the source region and the drain region, an effect similar to that set forth above can be achieved.

In the present invention, in the step of performing isotropic selective etching of the GaAs layer with respect to the AlGaAs layer, etching propagates in a transverse direction of the GaAs layer by over-etching after etching is reached to the AlGaAs layer. Furthermore, the etching distance in the transverse direction can be easily controlled by an etching period to form a recess having a desired transverse etching length. By this, concentration of the electric field on the drain region side of the gate electrode can be reduced to permit improvement of breakdown voltage characteristics.

FIG. 2 is an illustration showing controllability of selective etching obtained by over-etching ratio in the horizontal axis and a side etching amount in the vertical axis. FIG. 2 shows the dependency of the side etching distance relative to the over-etching ratio. For example, side etching of 20 nm can be performed by 100% of over-etching.

On the other hand, by contacting the ohmic electrode with at least one of a high concentration n-type GaAs cap layer and InGaAs channel layer or GaAs channel layer, the contact area of the two-dimensional electron transit layer and the ohmic region can be large to reduce contact resistance. Accordingly, lower rising voltage can be realized.

Furthermore, a compound semiconductor containing In, such as InAlGaAs can be etched by hydrochloric acid. On the other hand, since AlGaAs is not dissolved by hydrochloric acid, by employing the hetero junction of the InAlGaAs layer and the AlGaAs layer as the recessed region forming layer, the recessed structure can be formed with good controllability similarly to the step of isotropic selective etching of the GaAs layer and the AlGaAs layer as set forth above.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

First Embodiment

FIGS. 3A to 3F are sections showing a fabrication process of the first embodiment of a hetero junction FET according to the present invention, illustrated in sequential order of various process steps.

Figure 1A:
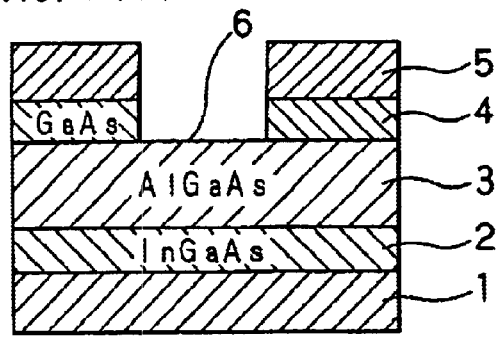
FIGS. 1A to 1D are sections showing the conventional fabrication process of a field effect transistor, illustrating process steps in sequential order.
Figure 1B:
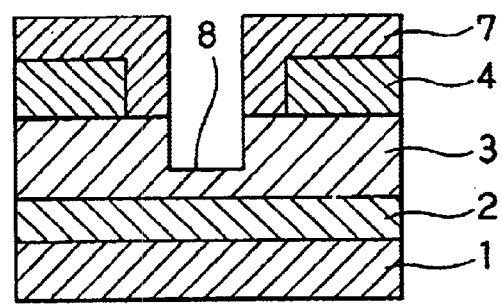
Figure 1C:
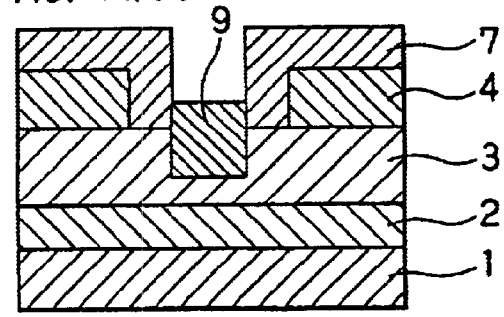
Figure 1D:
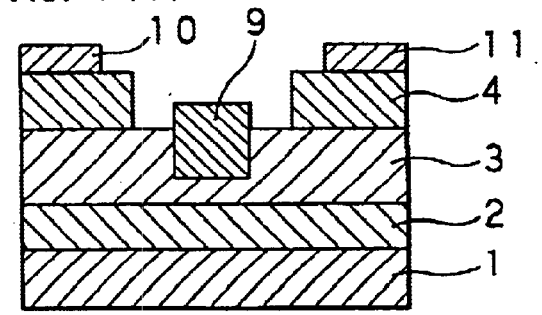
Figure 2:
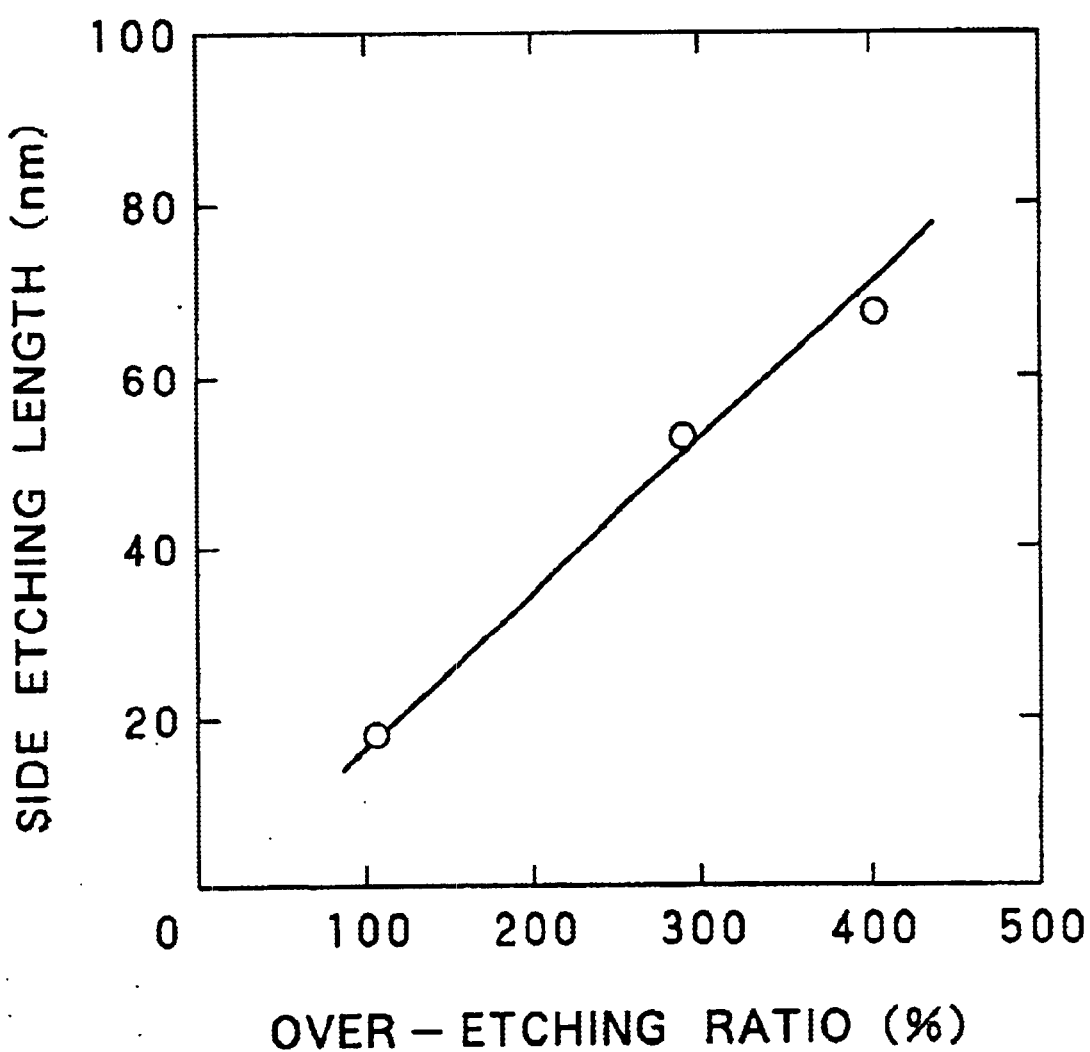
FIG. 2 is a graph showing a controllability of selective etching of the fabrication process according to the present invention.
Figure 3A:
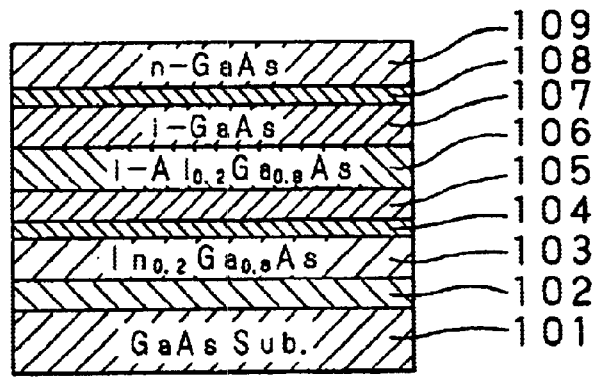
FIGS. 3A to 3F are sections of the first embodiment of a field effect transistor, showing process steps in fabrication of the first embodiment of the field effect transistor illustrated in sequential order.

At first, as shown in FIG. 3A, on the surface of a semi-insulative GaAs substrate 101, an undoped GaAs layer 102 (as a buffer layer) in a layer thickness of about 500 nm, an undoped $In_{0.2}Ga_{0.8}As$ channel layer 103 in a layer thickness of 14 nm, an undoped $Al_{0.2}Ga_{0.8}As$ layer 104 in a layer thickness of 2 nm, an $Al_{0.2}Ga_{0.8}As$ layer 105 doped with $4\times10^{18}$ $cm^{-3}$ of Si, which has a layer thickness of 9 nm, an undoped $Al_{0.2}Ga_{0.8}As$ layer 106 in a layer thickness of 25 nm, an undoped GaAs layer 107 in a layer thickness of 10 nm, an undoped $Al_{0.2}Ga_{0.8}As$ etching stopper layer 108 in a layer thickness of 6 nm, and an n-type GaAs layer 109 doped with $4\times10^{18}$ $cm^{-3}$ of Si, which has a layer thickness of 100 nm are formed in sequential order by way of an epitaxial growth method. An epitaxial wafer therefor may be fabricated by way of molecular beam epitaxy (MBE) method or a metal organic vapor phase epitaxy (MOVPE) method.

Figure 3B:
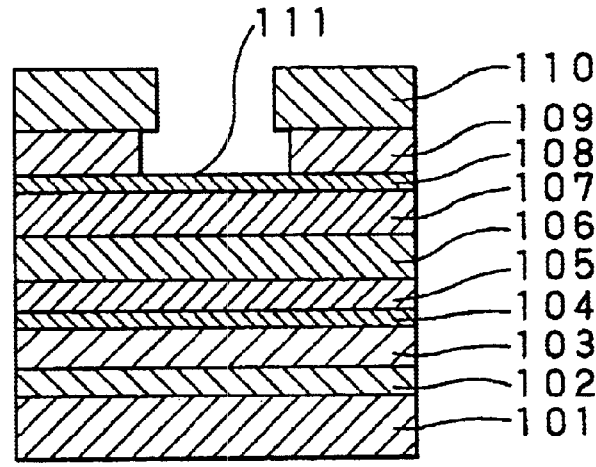

Next, as shown in FIG. 3B, a mask 110 opening a gate region is formed on the GaAs layer 109. Then, employing an ECR etching device or an RIE device, a mixture gas of a chloride gas containing only chlorine and a fluoride gas containing only fluorine, as a halogen element (e.g. $BCl_3$+ $SF_6$ and the like) is introduced into the ECR etching device or the RIE device to perform dry etching for removing the n-type GaAs layer 109 in the layer thickness of 100 nm is selectively etched with respect to the $Al_{0.2}Ga_{0.8}As$ etching stopper layer 108 to form a wide recess 111.

Figure 3C:
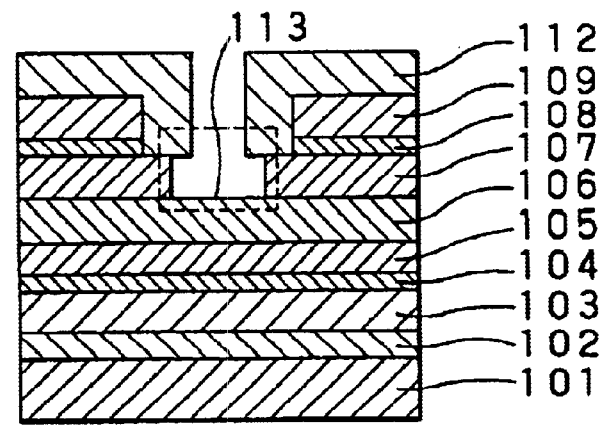
Figure 3D:
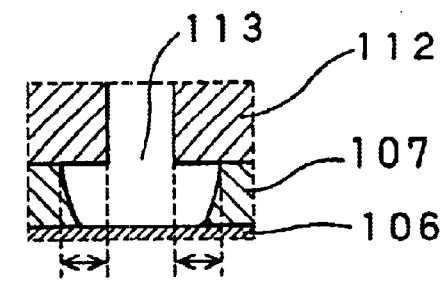

Next, as shown in FIG. 3C, after removing the $Al_{0.2}Ga_{0.8}As$ etching stopper layer 108 and the mask 110 at a portion exposed to the surface, the undoped GaAs layer 107 in the layer thickness of 10 nm is selectively etched with respect to the $Al_{0.2}Ga_{0.8}As$ layer 106 using the mask 112 having an opening at the gate region which has a narrower opening width than the mask 110, to form a gate opening portion 113. At this time, as shown in FIG. 3D, by over-etching the undoped GaAs layer 107, side etching progresses in the transverse direction of the undoped GaAs layer 107.

Figure 3E:
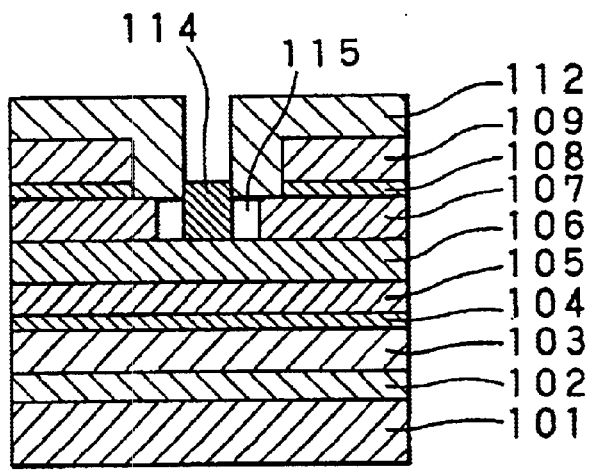

Next, as shown in FIG. 3E, by burying WSi in the gate opening portion 113 using the mask 112, a gate electrode 114 is formed.

In this case, by side etching, a gap 115 is formed between the gate electrode 114 and the GaAs layer 107 on the sides of the source and drain. For example, when 100% over-etching is performed by using a mixture gas of $BCl_3$+$SF_6$, a gap 115 of about 20 nm is formed. The width of the gap 115 (namely the gap between the gate electrode 114 and the GaAs layer 107) can be controlled by the ratio of over-etching.

Figure 3F:
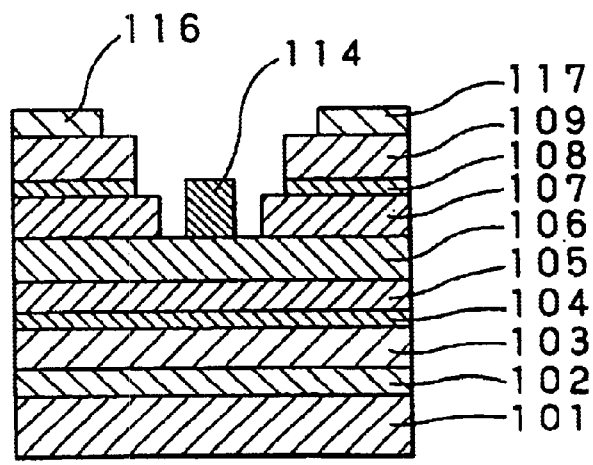

Next, as shown in FIG. 3F, the mask 112 is removed. After formation of a mask for the portion unnecessary for formation of the electrode, an AuGe layer is deposited over the entire surface. Then, the mask is removed to form an electrode pattern of AuGe by lift off. Furthermore, for alloying, the AuGe electrode pattern is subject heat treatment at 400° C. for one minute to form a source electrode 116 and a drain electrode 117 as ohmic electrodes.

As a result of fabrication of the shown embodiment of the hetero junction under the foregoing fabrication condition, a recessed structure as planned can be fabricated with high controllability and reproduction ability by employing selective dry etching in formation of the recess. Therefore, standard deviation of the threshold voltage could be suppressed to be small, such as 20 mV. Furthermore, since the gap is formed on the source and the drain region sides of the gate electrode, high breakdown voltage, such as 20V can be obtained as the gate breakdown voltage. On the other hand, by performing side etching for the GaAs layer 107, the mask 112 used for etching can be used for formation of the gate electrode, the number of process steps to perform lithography can be reduced thus contributing to a reduction of the number of process steps, and improvement of mass production capacity and improvement of yield.

Second Embodiment

FIGS. 4A to 4F are sections showing a fabrication process of the second embodiment of a hetero junction FET according to the present invention, illustrated in sequential order of various process steps.

Figure 4A:
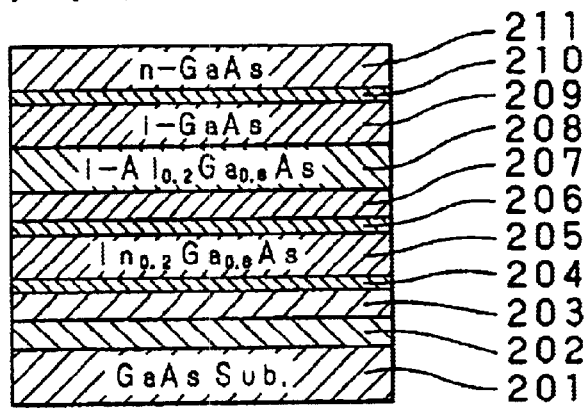
FIGS. 4A to 4F are sections of the second embodiment of a field effect transistor, showing process steps in fabrication of the second embodiment of the field effect transistor illustrated in sequential order.

At first, as shown in FIG. 4A, on the surface of a semi-insulative GaAs substrate 201, an undoped GaAs layer 202 (as a buffer layer) in a layer thickness of about 500 nm, an $Al_{0.2}Ga_{0.8}As$ layer 203 doped with $4\times10^{18}$ $cm^{-3}$ of Si in a layer thickness of 4 nm, an undoped $In_{0.2}Ga_{0.8}As$ layer 204 in a layer thickness of 2 nm, an undoped $Al_{0.2}Ga_{0.8}As$ layer 206 in a layer thickness of 14 nm, an $Al_{0.2}Ga_{0.8}As$ layer 207 doped with $4\times10^{18}$ $cm^{-3}$ of Si in a thickness of 9 nm, an undoped $Al_{0.2}Ga_{0.8}As$ layer 208 in a layer thickness of 25 nm, an undoped GaAs layer 209 in a layer thickness of 10 nm, an undoped $Al_{0.2}Ga_{0.8}As$ etching stopper layer 210 in a layer thickness of 6 nm and an n-type GaAs layer 211 doped with $4\times10^{18}$ $cm^{-3}$ of Si, which has a layer thickness of 100 nm are formed in sequential order by way of an epitaxial growth method. An epitaxial wafer therefor may be fabricated by way of molecular beam epitaxy (MBE) method or a metal organic vapor phase epitaxy (MOVPE) method.

Figure 4B:
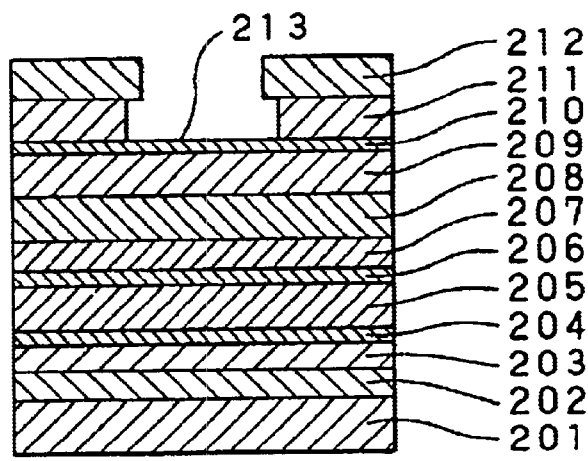

Next, as shown in FIG. 4B, a mask 212 opening a gate region is formed on the n-type GaAs layer 211. Then, employing an ECR etching device or an RIE device, a mixture gas of a chloride gas containing only chlorine and a fluoride gas containing only fluorine, as a halogen element (e.g. $BCl_3+SF_6$ and the like) is introduced into the ECR etching device or the RIE device to perform dry etching for selectively etching the n-type GaAs layer 211 in the layer thickness of 100 nm with respect to the $Al_{0.2}Ga_{0.8}As$ etching stopper layer 209 to form a gate opening portion 213.

Figure 4C:
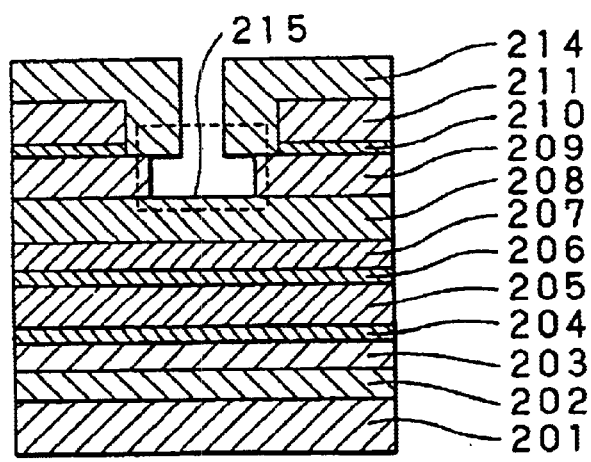

Next, as shown in FIG. 4C, after removing the $Al_{0.2}Ga_{0.8}As$ etching stopper layer 210 and the mask 212 at a portion exposed to the surface, the undoped GaAs layer 209 in the layer thickness of 10 nm is selectively etched with respect to the $Al_{0.2}Ga_{0.8}As$ layer 208, to form a gate opening portion 215, by using a mask 214 opening the gate region which has narrower opening width than the mask 212.

Figure 4D:
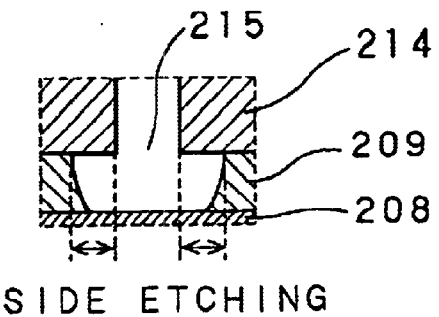

At this time, as shown in FIG. 4D, by over-etching the undoped GaAs layer 209, etching (side etching) progresses in the transverse direction of the undoped GaAs layer 209. Next, WSi is buried in the gate opening portion 215 with the mask 214 to form a gate electrode 216.

Figure 4E:
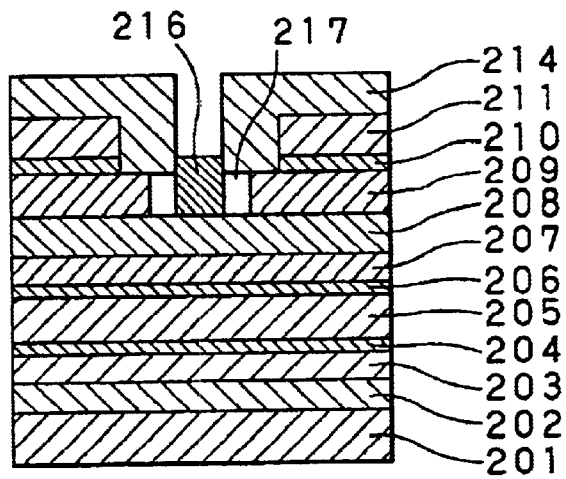

Next, as shown in FIG. 4E, by side etching, a gap 217 is formed on the source and drain sides of the gate electrode 216. For example, when 100% over-etching is performed by using a mixture gas of $BCl_3+SF_6$, a gap 217 of about 20 nm is formed. The width of the gap 217 (namely the gap between the gate electrode 216 and the $Al_{0.2}Ga_{0.8}As$ layer 208) can be controlled by the ratio of over-etching.

Figure 4F:
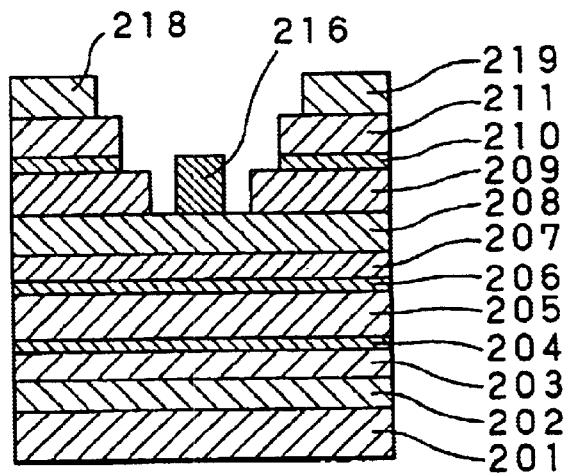

Next, as shown in FIG. 4F, the mask 214 is removed. Thereafter, by deposition and lift off method and alloying method of AuGe (e.g. 400° C. for 1 minute), a source electrode 218 and a drain electrode 219 are formed as ohmic electrodes. By this, element is completed.

As a result of fabrication of the shown embodiment of the hetero junction under the foregoing fabrication condition, standard deviation of the threshold voltage could be suppressed to be small, such as 20 mV. Furthermore, since the gap is formed on the drain region side of the gate electrode, high breakdown voltage, such as 18V can be obtained as the gate breakdown voltage. In addition, by employment of a double dope structure, a maximum drain current is 700 mA/mm which is higher than the element of the single dope structure in the extent of about 300 mA/mm.

Third Embodiment

FIGS. 5A to 5F are sections showing a fabrication process of the third embodiment of a hetero junction FET according to the present invention, illustrated in sequential order of various process steps.

Figure 5A:
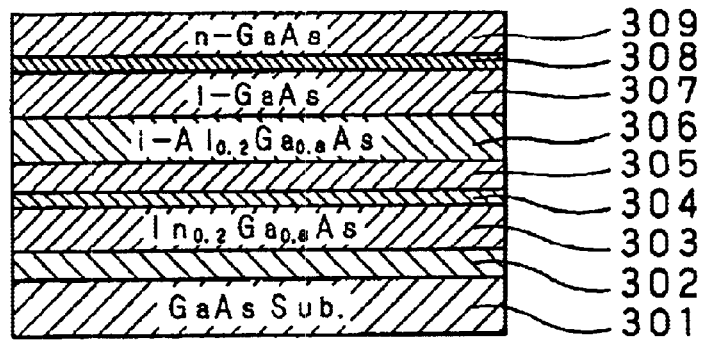
FIGS. 5A to 5F are sections of the third embodiment of a field effect transistor, showing process steps in fabrication of the third embodiment of the field effect transistor illustrated in sequential order.

At first, as shown in FIG. 5A, on the surface of a semi-insulative GaAs substrate 301, an undoped GaAs layer 302 (as a buffer layer) in a layer thickness of about 500 nm, an undoped $In_{0.2}Ga_{0.8}As$ channel layer 303 in a layer thickness of 14 nm, an undoped $Al_{0.2}Ga_{0.8}As$ layer 304 in a layer thickness of 2 nm, an $Al_{0.2}Ga_{0.8}As$ layer 305 doped with $4\times10^{18}$ $cm^{-3}$ of Si, which has a layer thickness of 9 nm, an undoped $Al_{0.2}Ga_{0.8}As$ layer 306 in a layer thickness of 25 nm, an undoped GaAs layer 307 in a layer thickness of 10 nm, an undoped $Al_{0.2}Ga_{0.8}As$ etching stopper layer 308 in a layer thickness of 6 nm, and an n-type GaAs layer 309 doped with $4\times10^{18}$ $cm^{-3}$ of Si, which has a layer thickness of 100 nm are formed in sequential order by way of an epitaxial growth method.

Figure 5B:
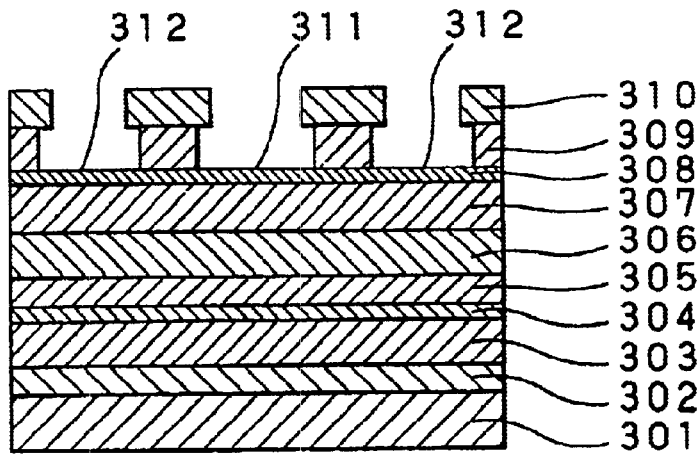

Next, as shown in FIG. 5B, a mask 310 opening a gate region is formed on the GaAs layer 309. Then, employing this mask 310, the n-type GaAs layer 309 is selectively etched with respect to the $Al_{0.2}Ga_{0.8}As$ etching stopper layer 308 by dry etching to form a wide recess 311 forming the gate and an opening portion 312 to be drain and source electrode regions.

Figure 5C:
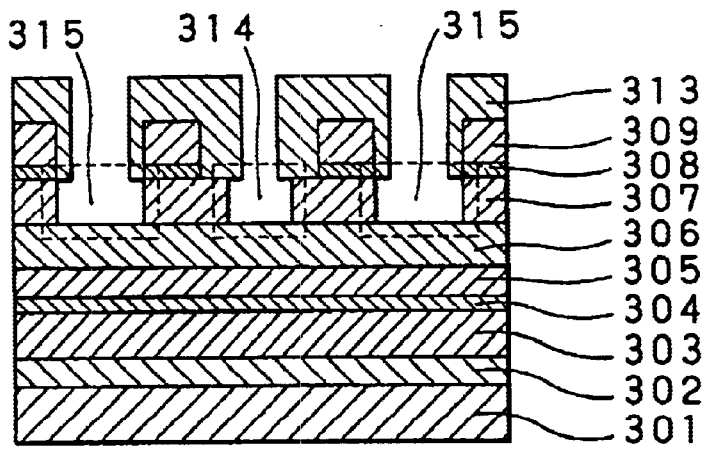

Next, as shown in FIG. 5C, after removing the $Al_{0.2}Ga_{0.8}As$ etching stopper layer 308 and the mask 310 at a portion exposed to the surface, the undoped GaAs layer 307 in the layer thickness of 10 nm is selectively etched with respect to the $Al_{0.2}Ga_{0.8}As$ layer 306 by dry etching employing a mask 313 opening a gate region and an ohmic region, to form a gate opening portion 314 and an ohmic opening portion 315.

Figure 5D:
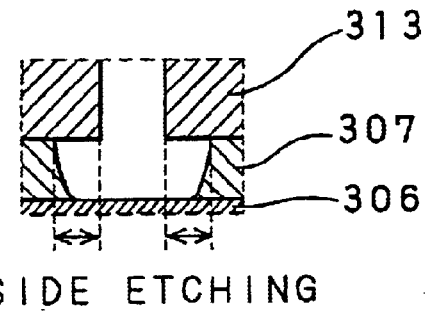

At this time, as shown in FIG. 5D, by performing excessive etching for the undoped GaAs layer 307, side etching progresses in the transverse direction of the undoped GaAs layer 307 in the gate opening portion 314 and the ohmic opening portion 315.

Figure 5E:
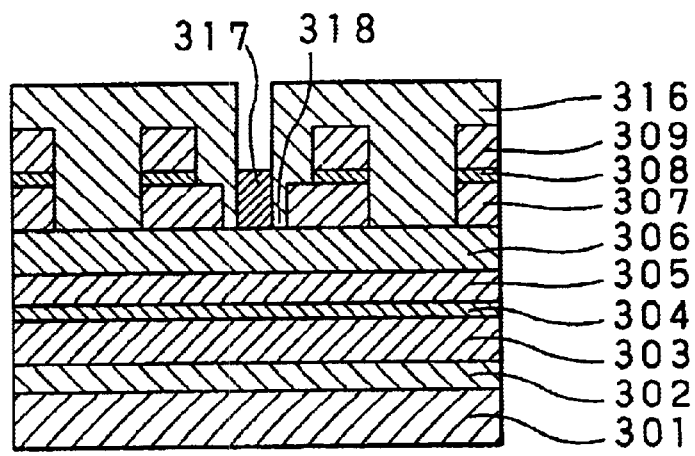

Next, as shown in FIG. 5E, by burying WSi in the gate opening portion using a mask 316 having opening in the gate portion, a gate electrode 317 is formed. After the mask 316 is removed, a gap 318 is formed on the drain side of the gate electrode 317. For example, when 100% over-etching is performed by using a mixture gas of $BCl_3 + SF_6$, a gap 317 of about 20 nm is formed.

Figure 5F:
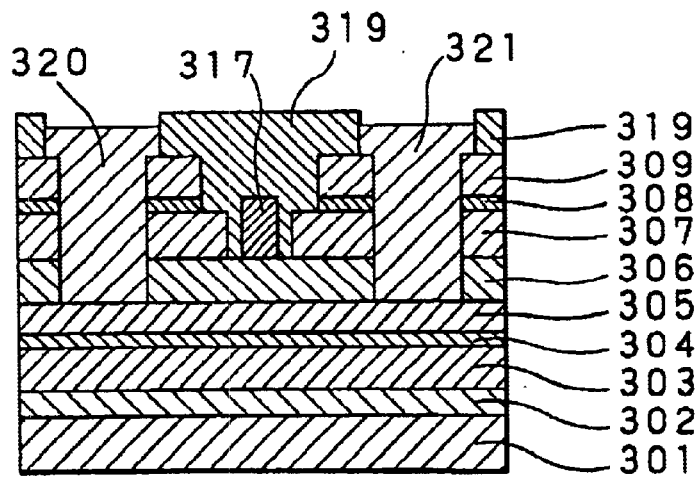

Next, as shown in FIG. 5F, after removal of the $Al_{0.2}Ga_{0.8}As$ layer 306 of the ohmic opening portion, deposition and lift off method and alloying (400° C. for 1 minute) of AlGe are performed employing a mask 319 which has a larger opening area than the ohmic opening portion 315 by 10% to form a source electrode 320 and a drain electrode 321 as ohmic electrodes. At this time, an ohmic metal is sintered in a depth of about 25 nm by alloying and contacts with the undoped $In_{0.2}Ga_{0.8}As$ channel layer 303. Subsequently, the mask 319 is removed to complete the element.

As a result of fabrication of the shown embodiment of the hetero junction FET under the foregoing fabrication condition, standard deviation of the threshold voltage could be suppressed to be small, such as 20 mV, since selective dry etching is used for forming the recess. Furthermore, since the gap is formed on the drain region side of the gate electrode, high breakdown voltage, such as 20 V can be obtained as the gate breakdown voltage. Also, since the ohmic electrode is in contact with at least the n-type GaAs layer in a layer thickness of 100 nm and the undoped $In_{0.2}Ga_{0.8}As$ channel layer, contact resistance can be reduced, and thus 2.1 Ω·mm of ON resistance is achieved. This is lower than ON resistance of a conventional element, in which the ohmic electrode is in contact with only n-type GaAs layer, to the extent of about 0.4 Ω·mm.

Fourth Embodiment

Figure 6A:
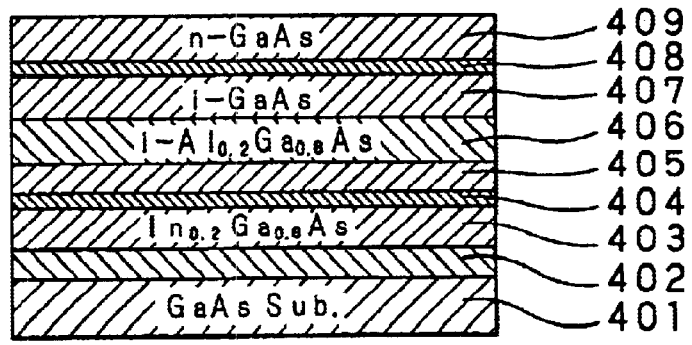
FIGS. 6A to 6E are sections of the fourth embodiment of a field effect transistor, showing process steps in fabrication of the fourth embodiment of the field effect transistor illustrated in sequential order.
Figure 6B:
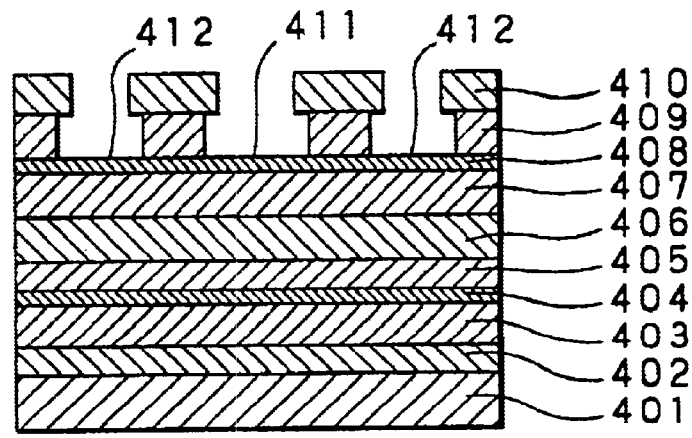
Figure 6C:
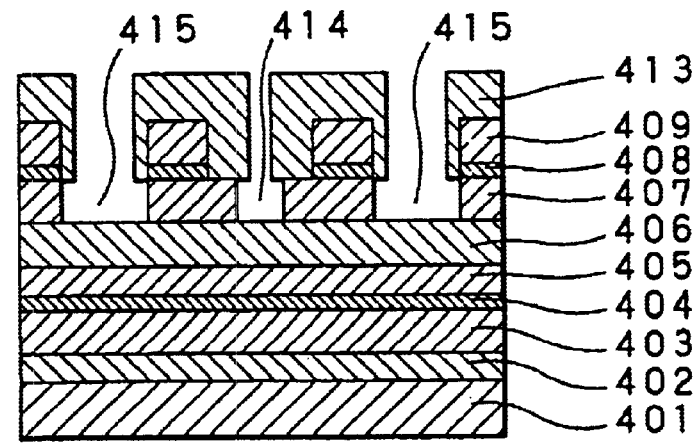

FIGS. 6A to 6E are sections showing a fabrication process of the sixth embodiment of the field effect transistor according to the present invention. In the shown embodiment, the process steps up to the step shown in FIG. 6B are the same as those in the third embodiment as illustrated in FIG. 5B. In the shown embodiment, as shown in FIG. 6C, the undoped GaAs layer 407 is selectively etched to form a gate opening portion 414 and an ohmic opening portion 415.

Figure 6D:
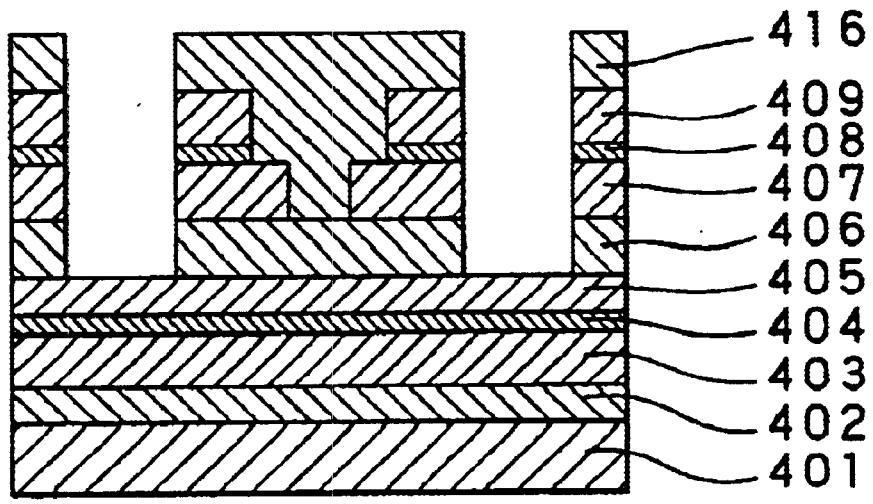

Next, as shown in FIG. 6D, employing a mask 416 opened to the ohmic portion 415, the undoped $Al_{0.2}Ga_{0.8}As$ layer 406, the $Al_{0.2}Ga_{0.8}As$ layer 405 doped with $4 \times 10^{18}$ $cm^{-3}$ of Si, which has a layer thickness of 9 nm and the undoped $Al_{0.2}Ga_{0.8}As$ layer 404 in the layer thickness of 2 nm are removed by an etchant containing sulfuric acid as a primary component.

Figure 6E:
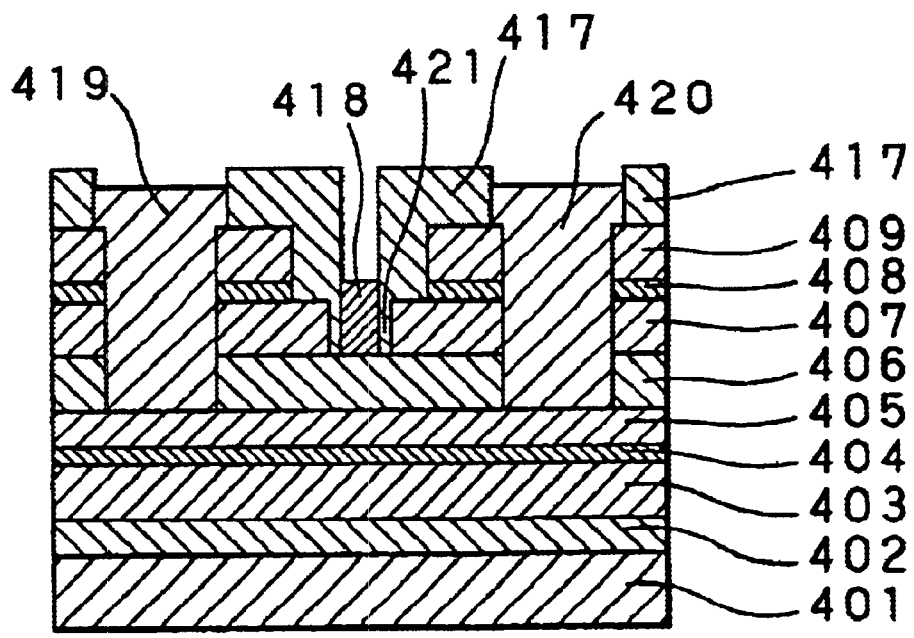

Next, as shown in FIG. 6E, using a mask 417 having an ohmic opening portion having greater opening area than that of the gate opening portion 414 and the ohmic opening portion 415, in a extent of approximately 10%, a gate electrode 418, a source electrode 419 and a drain electrode 420 are formed by deposition and lift off of Al. Thereafter, the mask 417 is removed to form a gap 421 and complete the element.

Even in the shown embodiment, the characteristics are comparable with the field effect transistor discussed in terms of the structure of the third embodiment.

Fifth Embodiment

Figure 7:
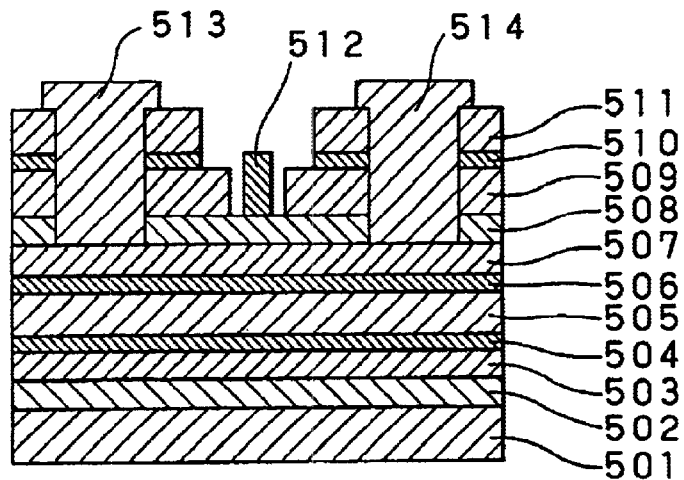
FIG. 7 is section of the fifth embodiment of a field effect transistor according to the present invention.

FIG. 7 is a section showing one process step of a fabrication process of the fifth embodiment of a field effect transistor according to the present invention. In the shown embodiment, on the surface of a semi-insulative GaAs substrate 501, an undoped GaAs layer 502 (as a buffer layer) in a layer thickness of about 500 nm, an $Al_{0.2}Ga_{0.8}As$ layer 503 doped with $4 \times 10^{18}$ $cm^{-3}$ of Si, which has a layer thickness of 4 nm, an undoped $Al_{0.2}Ga_{0.8}As$ 504 in a layer thickness of 2 nm, an undoped $In_{0.2}Ga_{0.8}As$ channel layer 505 in a layer thickness of 14 nm, an undoped $Al_{0.2}Ga_{0.8}As$ layer 506 in a layer thickness of 2 nm, an $Al_{0.2}Ga_{0.8}As$ layer 507 doped with $4 \times 10^{18}$ $cm^{-3}$ of Si, which has a layer thickness of 9 nm, an undoped $Al_{0.2}Ga_{0.8}As$ layer 508 in a layer thickness of 25 nm, an undoped GaAs layer 509 in a layer thickness of 10 nm, an undoped $Al_{0.2}Ga_{0.8}As$ etching stopper layer 510 in a layer thickness of 6 nm and an n-type GaAs layer 511 (double doped double hetero structure) doped with $4 \times 10^{18}$ $cm^{-3}$ of Si, which has a layer thickness of 100 nm are formed in sequential order by way of an epitaxial growth method.

According to the shown embodiment, a standard deviation of the threshold voltage could be suppressed to be small, such as 20 mV, since selective dry etching is used for forming the recess. Furthermore, since the gap is formed on the drain region side of the gate electrode, high breakdown voltage, such as 18 V can be obtained as the gate breakdown voltage. In addition, by employment of a double doped structure, a maximum drain current is 700 mA/mm which is higher than the element of a single doped structure to the extent of about 300 mA/mm. Also, since the ohmic electrode is in contact with at least the n-type GaAs layer in a layer thickness of 100 nm and the undoped $In_{0.2}Ga_{0.8}As$ channel layer, contact resistance can be reduced, and thus 21 Ω·mm of ON resistance is achieved. This is lower than ON resistance of conventional element, in which the ohmic electrode is in contact with only n-type GaAs layer in the layer thickness of 100 nm, to the extent of about 0.4 Ω·mm.

Sixth Embodiment

FIGS. 8A to 8F are sections showing a fabrication process of a sixth embodiment of a hetero junction HJFET according to the present invention, illustrated in sequential order of various process steps.

Figure 8A:
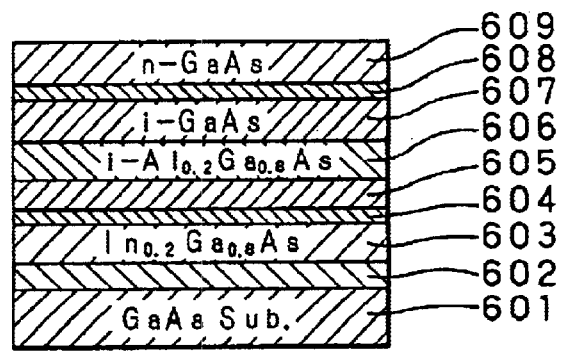
FIGS. 8A to 8E are sections of the sixth embodiment of a field effect transistor, showing process steps in fabrication of the sixth embodiment of the field effect transistor illustrated in sequential order.

At first, as shown in FIG. 8A, on the surface of a semi-insulative GaAs substrate 601, an undoped GaAs layer 602 (as a buffer layer) in a layer thickness of about 500 nm, an undoped $In_{0.2}Ga_{0.8}As$ channel layer 603 in a layer thickness of 14 nm, an undoped $Al_{0.2}Ga_{0.8}As$ layer 604 in a layer thickness of 2 nm, an $Al_{0.2}Ga_{0.8}As$ layer 605 doped with $4 \times 10^{18}$ $cm^{-3}$ of Si, which has a layer thickness of layer thickness of 9 nm, an undoped $Al_{0.2}Ga_{0.8}As$ layer 606 in a layer thickness of 25 nm, an undoped GaAs layer 607 in a layer thickness of 10 nm, an undoped $Al_{0.2}Ga_{0.8}As$ etching stopper layer 608 in a layer thickness of 6 nm, and an n-type GaAs layer 609 doped with $4 \times 10^{18}$ $cm^{-3}$ of Si, which has a layer thickness of 100 nm are formed in sequential order by way of an epitaxial growth method.

Figure 8B:
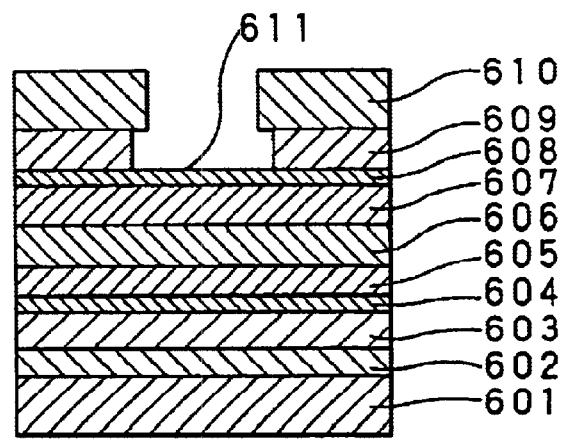

Next, as shown in FIG. 8B, employing a mask 610, the n-type GaAs layer 609 in the layer thickness of 100 nm is selectively etched with respect to the undoped $Al_{0.2}Ga_{0.8}As$ etching stopper layer 608 by dry etching to form a wide recess 611.

Figure 8C:
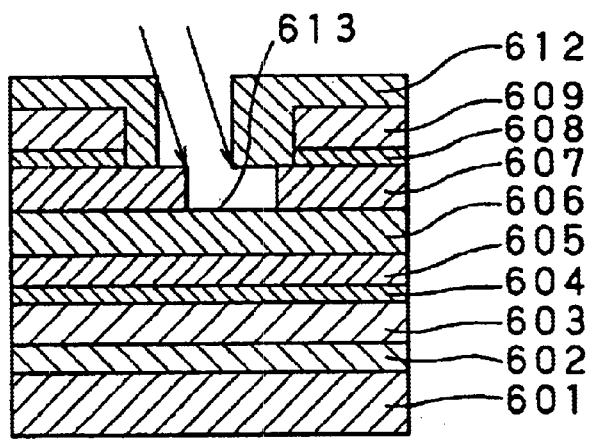

Next, as shown in FIG. 8C, the $Al_{0.2}Ga_{0.8}As$ etching stopper layer 608 and the mask 610 are removed. Then, by arranging a mask 612 opening in the gate electrode portion, which has a layer thickness of about 400 nm, the semi-insulative GaAs substrate 601 is tilted at an angle of about 45°. An isotropic etching is performed of the undoped GaAs layer 607 in the layer thickness of 10 nm in the oblique direction from upper side of the source region toward the drain region to form a gate electrode opening portion 613. At this time, the gate electrode opening portion 613 is offset toward the drain region in a magnitude of about 400 nm from the gate opening portion.

Figure 8D:
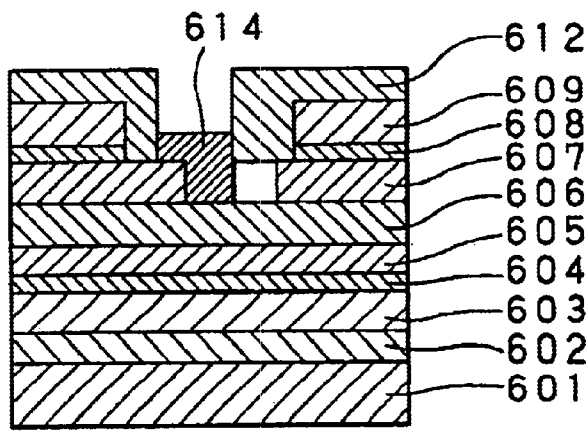

Next, as shown in FIG. 8D, a gate electrode 614 of Al is formed by deposition from above in the perpendicular direction with respect to the substrate 601 and lift off, or ion beam method. At this time, a recess of about 400 nm is formed on the side of the drain region of the gate electrode 614.

Figure 8E:
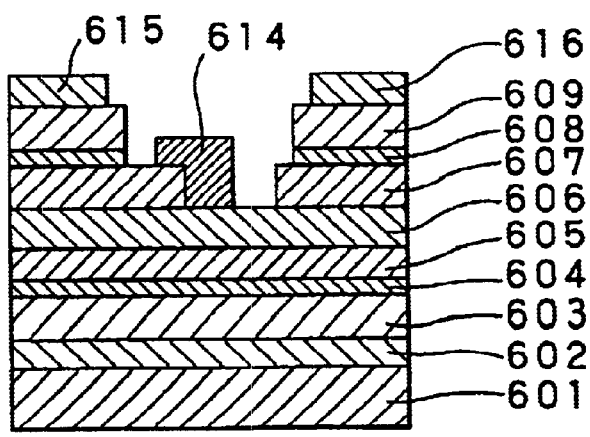

Next, as shown in FIG. 8E, by performing deposition and lift off method and alloying (400° C. for 1 minute) of ohmic metal of AuGe, a source electrode 615 and a drain electrode 616 are formed.

In the shown embodiment, for employing an isotropic etching by tilting the GaAs substrate upon forming of the recess formation, a gap is formed on the side of the drain region of the gate electrode. Thus, a high gate breakdown voltage of about 18V can be obtained.

On the other hand, in the shown embodiment, the mask 612 opening the gate electrode portion having a layer thickness of 400 nm is arranged in the vicinity of the source region. The gate electrode is offset toward the source electrode to reduce a source resistance.

Seventh Embodiment

FIGS. 9A to 9E are sections showing a fabrication process of a seventh embodiment of a hetero junction FET according to the present invention, illustrated in sequential order of various process steps.

Figure 9A:
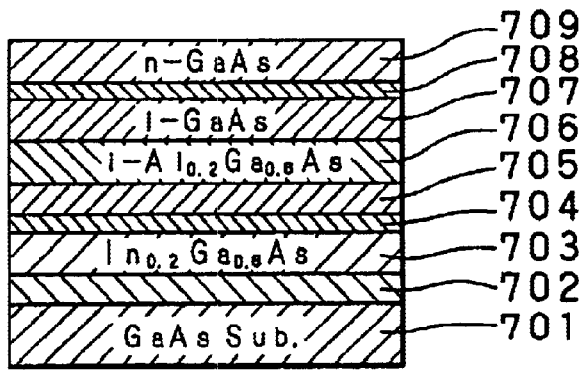
FIGS. 9A to 9E are sections of the seventh embodiment of a field effect transistor, showing process steps in fabrication of the seventh embodiment of the field effect transistor illustrated in sequential order.

At first, as shown in FIG. 9A, on the surface of a semi-insulative GaAs substrate 701, an undoped GaAs layer 702 (as a buffer layer) in a layer thickness of about 500 nm, an undoped $In_{0.2}Ga_{0.8}As$ layer 703 in a layer thickness of 14 nm, an undoped $Al_{0.2}Ga_{0.8}As$ layer 704 in a layer thickness of 2 nm, an $Al_{0.2}Ga_{0.8}As$ layer 705 doped with $4\times10^{18}$ cm$^{-3}$ of Si, which has a layer thickness of 9 nm, an undoped $Al_{0.2}Ga_{0.8}As$ layer 706 in a layer thickness of 25 nm, an undoped GaAs layer 707 in a layer thickness of 10 nm, an undoped $Al_{0.2}Ga_{0.8}As$ etching stopper layer 708 in a layer thickness of 6 nm, and an n-type GaAs layer 709 doped with $4\times10^{18}$ cm$^{-3}$ of Si, which has a layer thickness of 100 nm are formed in sequential order by way of an epitaxial growth method. The epitaxial wafer can be easily formed by MBE method or MOVPE method.

Figure 9B:
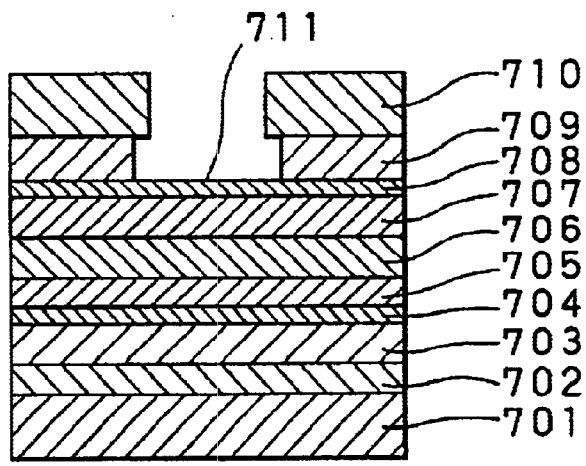

Next, as shown in FIG. 9B, employing a mask 710, the n-type GaAs layer 709 is selectively etched with respect to the undoped $Al_{0.2}Ga_{0.8}As$ etching stopper layer 708 by dry etching to form a wide recess 711.

Figure 9C:
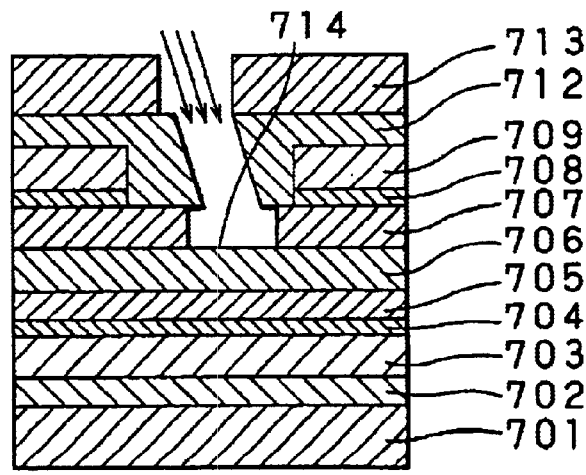

Next, as shown in FIG. 9C, after removing the undoped $Al_{0.2}Ga_{0.8}As$ etching stopper layer 708, an $SiO_2$ layer 712 in a layer thickness of about 400 nm is arranged. Subsequently, employing a mask 713 which has an opening portion located at intermediate position of the gate region and the source region, the semi-insulative GaAs substrate 701 is tilted at an angle of 45°. The $SiO_2$ layer 712 in a layer thickness of about 400 nm is etched by anisotropic etching in an oblique direction from the upper side of the source region toward the drain region.

Next, employing the $SiO_2$ layer 712, the undoped GaAs layer 707 in a layer thickness of 10 nm is selectively etched with respect to the undoped $Al_{0.2}Ga_{0.8}As$ layer 706 in a layer thickness of 25 nm by dry etching, to form a gate opening portion 714.

Figure 9D:
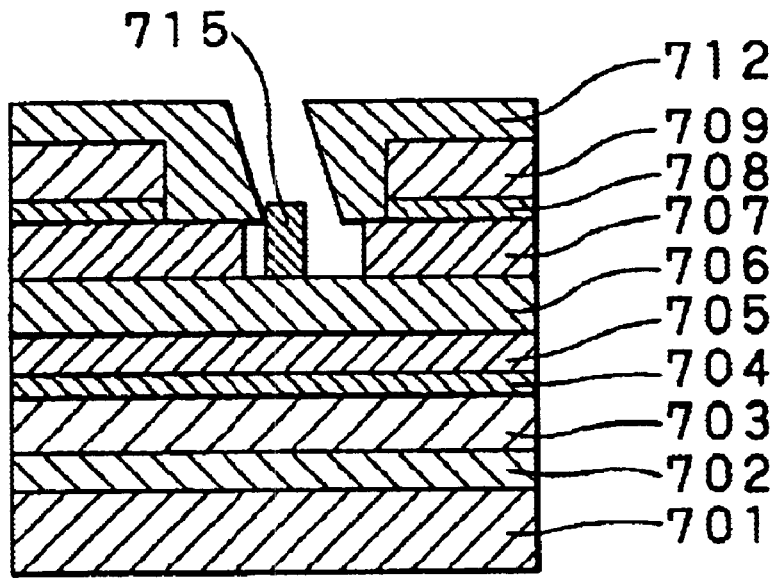

At this time, as shown in FIGS. 9C and 9D, by overetching of the undoped GaAs layer 707, etching (side etching) progresses in the transverse direction of the undoped GaAs layer 707. For example, when 100% over-etching is performed by employing a mixture gas of $BCl_3+SF_6$, side etching amount is in the extent of about 20 nm.

Next, as shown in FIG. 9D, through the opening of the $SiO_2$ layer 712, a gate electrode 715 of Al is formed on the undoped $Al_{0.2}Ga_{0.8}As$ layer 706 by deposition and lift off method from above in the perpendicular direction with respect to the GaAs substrate 701, and ion beam method.

Figure 9E:
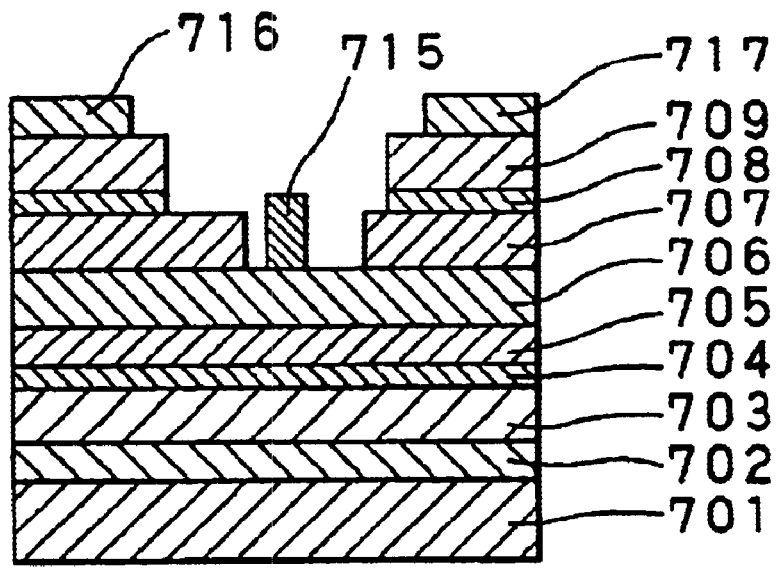

Next, as shown in FIG. 9E, after removal of the $SiO_2$ layer 712, deposition and lift off method and alloying (400° C. for 1 minute) of AuGe are performed to form a source electrode 716 and a drain electrode 717 as ohmic electrodes.

In the shown embodiment, since selective dry etching is employed in formation of the recess, standard deviation of the threshold voltage can be suppressed as 20 mV. Furthermore, since the gate electrode is offset toward the source region side, a high gate breakdown voltage as 20V can be obtained in conjunction with 0.4 Ω·mm of source resistance. Also, the two stage recess offsetting gate structure FET can be formed through lithographic process one step less than the conventional method.

Eighth Embodiment

FIGS. 10A to 10F are sections showing a fabrication process of an eighth embodiment of a hetero junction FET according to the present invention, illustrated in sequential order of various process steps.

Figure 10A:
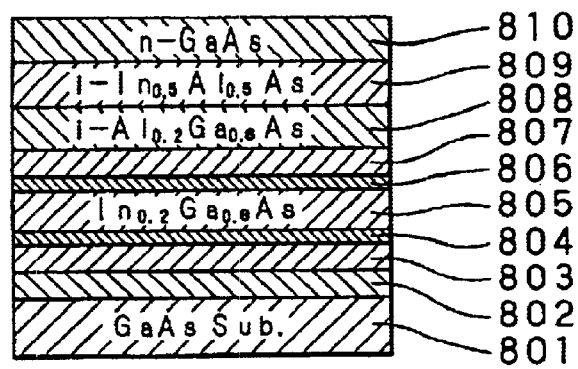
FIGS. 10A to 10F are sections of the eighth embodiment of a field effect transistor, showing process steps in fabrication of the eighth embodiment of the field effect transistor illustrated in sequential order.

At first, as shown in FIG. 10A, on the surface of a semi-insulative GaAs substrate 801 in a diameter of 3 inches, an undoped GaAs layer 802 (as a buffer layer) in a layer thickness of about 500 nm, an $Al_{0.2}Ga_{0.8}As$ layer 803 doped with $4\times10^{18}$ cm$^{-3}$ of Si, which has a layer thickness of 4 nm, an undoped $Al_{0.2}Ga_{0.8}As$ layer 804 in a layer thickness of 2 nm, an undoped $In_{0.2}Ga_{0.8}As$ channel layer 805 in a layer thickness of 14 nm, an undoped $Al_{0.2}Ga_{0.8}As$ layer 806 in a layer thickness of 2 nm, an $Al_{0.2}Ga_{0.8}As$ layer 807 doped with $4\times10^{18}$ cm$^{-3}$, which has a layer thickness of 9 nm, an undoped $In_{0.2}Ga_{0.8}As$ layer 808 in a layer thickness of 20 nm, an $In_{0.5}Ga_{0.5}As$ layer 809 in a layer thickness of 15 nm and an n-type GaAs layer 811 doped with $4\times10^{18}$ cm$^{-3}$ of Si, which has a layer thickness of 100 nm are formed in sequential order by way of an epitaxial growth method. The epitaxial well can be easily fabricated by the MBE method or the MOVPE method.

Figure 10B:
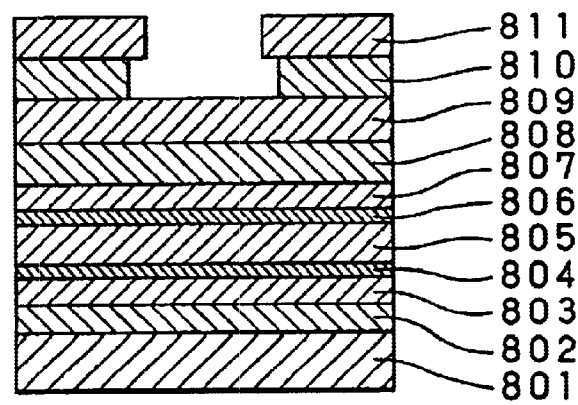

Next, as shown in FIG. 10B, a wide recess structure is formed by removing n-type GaAs layer 810 employing a mask 811.

Figure 10C:
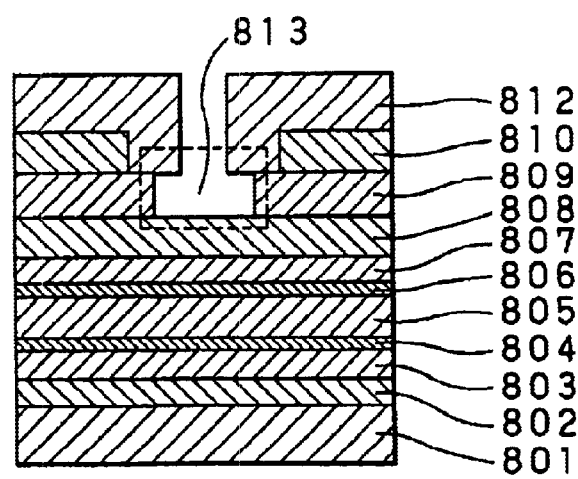

Then, as shown in FIG. 10C, by arranging a mask 812, a narrow recess is formed by employing a chloric acid type etchant. The etchant employed herein is a selective etchant which resolves the $In_{0.5}Ga_{0.5}As$ layer 809 but does not resolve the $Al_{0.2}Ga_{0.8}As$ layer 808 below the $In_{0.5}Ga_{0.5}As$ layer 809. Chloric acid is prepared by solving hydrogen chloride in water and the etchant may solve a compound semiconductor containing In. As a result of study, in case of an etchant having a composition of (hydro chloride): (water)=1:x (x<6), good selectivity and practically acceptable etching speed can be obtained. Here, an etchant prepared by mixing chloric acid and distilled water in a ratio of 1:1.

It should be noted that in place of $In_{0.5}Ga_{0.5}As$ layer 809, an InAlGaAs layer may be employed.

Figure 10D:
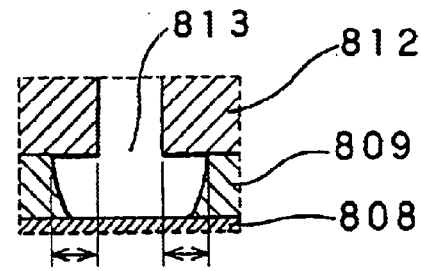

Here, as shown in FIG. 10D, in etching, after removal of $In_{0.5}Al_{0.5}As$ layer 809 under the opening portion of the mask 812, by performing excessive etching, side etching progresses in the transverse direction of the undoped $In_{0.5}Al_{0.5}As$ layer 809 in the gate opening portion 813.

Figure 10E:
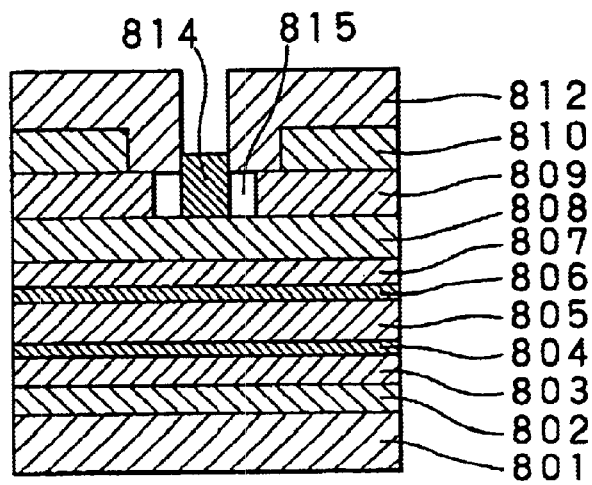

Next, as shown in FIG. 10E, a gate electrode 814 of WSi is formed employing the mask 812. At this time, a gap 815 is formed by side etching on the drain side of the gate electrode 814. For example, in case that 100% over-etching is effected, a gap 815 in a width of about 15 nm is formed.

Figure 10F:
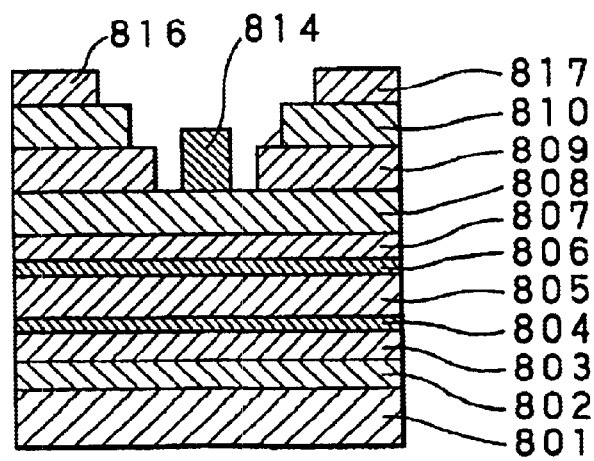

Then, as shown in FIG. 10F, AuGe is deposited as ohmic metal. After lift off, heat treatment for alloying is performed to form a source electrode 816 and a drain electrode 817.

In the shown embodiment, since selective dry etching is employed in formation of the recess, standard deviation of the threshold voltage can be suppressed as 30 mV. Furthermore, since the gap is formed on the drain region side of the gate electrode, a high gate breakdown voltage as 20V can be obtained.

Also, the eighth embodiment shown in FIGS. 10A to 10F has a double doping step so that the FET thus fabricated has a double hetero structure. On the other hand, a single hetero structure may also be fabricated by the shown embodiment, similarly. A maximum drain current of the double hetero structure FET is 600 mA/mm and thus is suitable for high power element. On the other hand, the maximum drain current of the single hetero structure is about 300 mA/mm. However, a single hetero structure has a high mutual conductance at a specific bias point and thus is suitable for low noise amplifier.

While an example of a typically employed InGaAs channel layer having In content of about 0.2 atomic % formed on the GaAs substrate is described, similar result can be obtained even by replacing it with GaAs channel layer.

On the other hand, a hetero junction FET fabricated on an InP substrate, constituted by substituting AlGaAs layer with $In_{0.5}Al_{0.5}As$ layer and substituting $In_{0.2}Ga_{0.8}As$ layer with $In_{0.5}Ga_{0.5}As$ layer, can obtain similar effect. In this case, it may be possible to employ tartaric acid etchant for an InP hetero junction FET in place of a dry etching method introducing a mixture gas of chloride gas containing only chlorine and fluoride gas containing only fluorine (e.g. $BCl_3+SF_6$) as halogen element, into the ECR etching device or the RIE device employed in the GaAs type hetero junction FET.

As set forth above, in a field effect transistor and its fabrication process, the GaAs layer is selectively etched isotropically. Therefore, fluctuation of characteristics of the element can be smaller than that of the method depending upon the etching period. Furthermore, good reproducibility in fabrication of the FET can be attained.

Also, etching of the GaAs layer, the InAlAs layer or the InAlGaAs layer in the transverse direction can be performed simultaneously, and further, the extent of etching can be easily controlled. By this, the recess can be formed on both sides of the gate electrode to permit improvement of the breakdown voltage. Also, the number of lithographic processes for formation of the gate can be reduced, thereby being superior in mass production capability and high yield.

On the other hand, by performing an isotropic etching of the GaAs layer or the gate electrode opening mask, in an oblique direction toward the drain electrode from the above of a source electrode, a width of the recess between the gate electrode and the drain electrode can be greater than the width of the recess between the gate electrode and the source electrode. Thus, in order to lower source resistance, it is effective in lowering of a rising voltage for reduction of the source resistance.

On the other hand, by contacting the ohmic electrode to at least one of the high concentration n-type GaAs cap layer and InGaAs channel layer or GaAs channel layer, contact resistance can be made smaller and thus is effective for lowering rising voltage. The low rising voltage is effective for improvement of output in low voltage operation and efficiency characteristics. Thus, the field effect transistor of the present invention is suitable for high power element to be employed in a transmission means of a mobile communication terminal (such as a portable phone and so forth).

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A fabrication process of a field effect transistor comprising the steps of:

forming a hetero junction semiconductor crystal having a channel layer of InGaAs or GaAs, a first AlGaAs layer, a first GaAs layer, a second AlGaAs layer and an n-type second GaAs layer;

forming a two stage recess structure by selective etching of said first GaAs layer and said second GaAs layer with respect to said first AlGaAs layer and said second AlGaAs layer for removing said first and second GaAs layers in stepwise fashion in the vicinity of a gate electrode forming portion;

performing etching in a transverse direction with respect to said first GaAs layer by performing excessive etching after reaching to said first AlGaAs layer in said selective etching with respect to said first GaAs layer, without etching said first AlGaAs layer; and forming a gate electrode on said first AlGaAs layer so as to define a gap between said first GaAs layer and said gate electrode, whereby said gate electrode does not contact with said first GaAs layer.

2. A fabrication process of a field effect transistor comprising the steps of:

forming a hetero junction semiconductor crystal having a channel layer of InGaAs or GaAs, a first AlGaAs layer, a first GaAs layer, a second AlGaAs layer and an n-type second GaAs layer;

selectively etching said first GaAs layer with respect to said first AlGaAs layer using a second mask after said second GaAs layer and said second AlGaAs layer are removed using a first mask which has an opening at an ohmic region;

forming an ohmic electrode by deposition and lift off of ohmic metal and heat treatment for alloying so as to contact to at least said second GaAs layer and said channel layer or said second GaAs layer and said first AlGaAs layer doped with a donor and forming a gate electrode on said first AlGaAs layer so as to define a gap between said first GaAs layer and said gate electrode, whereby said gate electrode does not contact with said first GaAs layer.

3. A fabrication process of a field effect transistor employing a hetero junction semiconductor crystal, in which a GaAs layer is stacked on an AlGaAs layer, comprising the steps of:

forming a hetero junction semiconductor crystal having a channel layer of InGaAs or GaAs, a first AlGaAs layer, a first GaAs layer, a second AlGaAs layer and a second GaAs layer;

forming a two stage recess structure by selective etching of said first GaAs layer and said second GaAs layer with respect to said first AlGaAs layer and said second AlGaAs layer for removing said first and second GaAs layers in stepwise fashion in the vicinity of a gate electrode forming portion;

performing an anisotropic etching of said GaAs layer in an oblique direction from the upper side of one of regions of a source region and a drain region, by arranging a mask opening a gate electrode portion on the crystal; and forming a gate metal on said AlGaAs layer by deposition and lift off from the above in the perpendicular direction with respect to a substrate or an ion beam method.

4. A fabrication process of a field effect transistor employing a hetero junction semiconductor crystal, in which a GaAs layer is stacked on an AlGaAs layer, comprising the steps of:

forming a hetero junction semiconductor crystal having a channel layer of InGaAs or GaAs, a first AlGaAs layer, a first GaAs layer, a second AlGaAs layer and a second GaAs layer;

forming a two stage recess structure by selective etching of said first GaAs layer and said second GaAs layer with respect to said first AlGaAs layer and said second AlGaAs layer for removing said first and second GaAs layers in stepwise fashion in the vicinity of a gate electrode forming portion;

arranging a first mask on said semiconductor crystal and performing an anisotropic etching of said first mask in an oblique direction toward a drain region from the upper side of a source region using a second mask opening a gate electrode portion;

etching said GaAs layer using said first mask; and forming a gate electrode by deposition of a gate metal from the above in the perpendicular direction with respect to a substrate and lift off or an ion beam method from the above in the perpendicular direction with respect to said substrate.

5. A fabrication process of a field effect transistor comprising the steps of:

forming a hetero junction semiconductor crystal having a channel layer of InGaAs or GaAs, an AlGaAs layer, a layer of InAlAs or InAlGaAs and an n-type GaAs layer;

forming a first stage recess structure removing a part of said n-type GaAs layer;

forming a mask for use in patterning a second stage recess structure;

selectively etching said layer or InAlAs or InAlGaAs on said AlGaAs layer employing an etchant having a composition of (hydrogen chloride):(water)=1:x (x<6); and propagating etching in transverse direction with respect to the layer of InAlAs or InAlGaAs by excessive etching after selective etching of said layer of InAlAs or InAlGaAs reaches to said AlGaAs layer.

6. A fabrication process of a field effect transistor comprising the steps of:

forming a hetero junction semiconductor crystal having a channel layer of InGaAs or GaAs, a first AlGaAs layer, a first GaAs layer, a second AlGaAs layer and an n-type second GaAs layer, wherein said first and second GaAs layers are removed in a stepwise fashion;

selectively etching said first GaAs layer with respect to said first AlGaAs layer using a second mask after said second GaAs layer and said second AlGaAs layer are removed using a first mask which has an opening at an ohmic region;

forming an ohmic electrode by deposition and lift off of ohmic metal and heat treatment for alloying so as to contact to at least said second GaAs layer and said channel layer or said second GaAs layer and said first AlGaAs layer doped with a donor; and forming a gate electrode on said first AlGaAs layer so as to define a gap between said first GaAs layer and said gate electrode, whereby said gate electrode does not contact with said first GaAs layer.

* * * * *